United States Patent
Yalamanchili et al.

(10) Patent No.: US 6,230,720 B1
(45) Date of Patent: May 15, 2001

(54) SINGLE-OPERATION METHOD OF CLEANING SEMICONDUCTORS AFTER FINAL POLISHING

(75) Inventors: M. Rao Yalamanchili, Eagle, ID (US); Kari B. Myli, Tecumseh (CA); Larry W. Shive, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/606,728

(22) Filed: Jun. 29, 2000

Related U.S. Application Data
(60) Provisional application No. 60/149,212, filed on Aug. 17, 1999, and provisional application No. 60/149,123, filed on Aug. 16, 1999.

(51) Int. Cl.$^7$ .................................................. C23G 1/02
(52) U.S. Cl. ................................ 134/1.3; 134/2; 134/3; 134/26; 134/27; 134/28; 134/29; 134/36; 134/41; 134/902
(58) Field of Search ........................... 134/1.3, 2, 3, 26, 134/27, 28, 29, 36, 41, 902

(56) References Cited

U.S. PATENT DOCUMENTS

| | | |
|---|---|---|
| 4,050,954 | 9/1977 | Basi . |
| 5,516,730 * | 5/1996 | Saeed et al. ............................ 437/235 |
| 5,626,159 | 5/1997 | Erk et al. ................................ 134/147 |
| 5,635,053 | 6/1997 | Aoki et al. ............................... 205/746 |
| 5,637,151 | 6/1997 | Schulz ........................................ 134/2 |
| 5,656,097 | 8/1997 | Olesen et al. .............................. 134/1 |
| 5,679,171 | 10/1997 | Saga et al. ................................. 134/3 |
| 5,695,572 | 12/1997 | Brunner et al. ............................ 134/3 |
| 5,712,198 | 1/1998 | Shive et al. ............................ 437/235 |
| 5,830,280 * | 11/1998 | Sato et al. ................................. 134/2 |
| 5,837,662 | 11/1998 | Chai et al. ............................. 510/175 |
| 5,919,311 | 7/1999 | Shive et al. ................................ 134/1 |
| 5,932,022 * | 8/1999 | Linn et al. ................................. 134/2 |
| 5,938,857 * | 8/1999 | Fujiwara et al. .......................... 134/2 |
| 6,099,662 * | 8/2000 | Wang et al. .............................. 134/26 |
| 6,146,467 * | 11/2000 | Takaishi et al. ........................... 134/3 |
| 6,165,279 * | 12/2000 | Tsao et al. ................................. 134/3 |

FOREIGN PATENT DOCUMENTS

| | | |
|---|---|---|
| 0 701 275 | 3/1996 | (EP) . |
| 0 718 873 | 6/1996 | (EP) . |
| 0 844 650 | 5/1998 | (EP) . |

OTHER PUBLICATIONS

PCT International Search Report for PCT/US00/21601 dated Nov. 29, 2000.

* cited by examiner

*Primary Examiner*—Sharidan Carrillo
(74) *Attorney, Agent, or Firm*—Senniger, Powers, Leavitt & Roedel

(57) ABSTRACT

A process for cleaning a final polished semiconductor wafer in a single operation (i.e., following final polishing, a process or action is directed at the wafer which includes drying the wafer only once, thereby yielding a polished wafer surface substantially free of contaminants). The process comprising contacting the polished wafer with an aqueous solution comprising an oxidizing agent to oxidize organic carbon on the surface of the polished wafer. After oxidizing the organic carbon, immersing the polished wafer in an megasonically agitated alkaline cleaning solution to reduce the surface concentration of contaminant particles exceeding 0.2 $\mu$m in diameter. Withdrawing the polished wafer from the alkaline cleaning solution and rinsing it with deionized water. After rinsing, immersing the polished wafer in an acidic cleaning solution to reduce the surface concentration of contaminant metal atoms. Withdrawing the polished wafer from the acidic cleaning solution and immersing it in an ozonated aqueous bath. Withdrawing the polished wafer from the aqueous bath and drying the wafer. The process is further characterized by the absence of a step in which the surface of the polished wafer is dried between oxidizing organic carbon on the surface and immersing the wafer in the ozonated aqueous bath.

54 Claims, 4 Drawing Sheets

Fig. 2

Input station with a transfer robot and a buffer
queue to hold 4 process carriers (made by Keller, Germany)
↓
Recirculated Ozone quartz tank
9 min.
↓
Megasonic alkaline solution
quartz tank with dual transducers (Verteq)
65 °C, 500 W, 8 min 40 sec
↓
Deionized Water Rinse
(quartz tank made by Verteq)
6 Quick Dump Rinses, 8 min. 20 sec.
↓
Megasonic alkaline solution
quartz tank with dual transducers (Verteq)
65 °C, 500 W, 8 min.
↓
Deionized Water Rinse
6 Quick Dump Rinses, 7 min. 40 sec.
↓
Acid solution
quartz tank with in-tank heaters
70 °C, 7 min. 20 sec.
↓
Deionized Water Rinse
6 Quick Dump Rinses, 7 min.
↓
Ozone over flow quartz tank
6 min 20 sec
↓
IPA Steam dryer
(S&K International)
5 min 30 sec
↓
Output station with a transfer robot and a buffer
queue to hold 4 process carriers (made by Keller, Germany)

Fig. 3

Table 1. Number of particles on the front surface of
single-operation cleaned 300 mm wafers

| Particles | >0.12 $\mu$m | >0.2 $\mu$m |
|---|---|---|
| Average | 27.6 | 9.7 |
| Average + 3 Sigma* | 55 | 21 |

*based on three parameter log-normal distribution fit

Fig. 4

Table 2. Amount of surface metal
on single-operation cleaned 300 mm wafers

| Surface Metal | Average<br>1 x $10^{10}$ atoms/cm² | Average + 3 Sigma*<br>1 x $10^{10}$ atoms/cm² |
|---|---|---|
| K | 0.06 | 0.5 |
| Ca | 0.35 | 1.1 |
| Na | 0.23 | 1.1 |
| Fe | 0.08 | 0.22 |
| Al | 0.53 | 1.2 |
| Cr | 0.006 | 0.016 |
| Ni | 0.30 | 0.88 |
| Cu | 0.20 | 0.63 |
| Zn | 0.13 | 0.39 |

*based on three parameter log-normal distribution fit

Fig. 5

Table 3. Average amount of organic compounds and ions
on the surface of single-operation cleaned 300 mm wafers

| organic compounds | $0.4 \times 10^{14}$ organic carbon atoms/cm2 |
|---|---|
| ions | $NH_4^+ = 729 \times 10^{10}/cm^2$<br>$Cl^- = 339 \times 10^{10}/cm^2$<br>no degradation haze observed following 4 day rapid haze test |

SINGLE-OPERATION METHOD OF CLEANING SEMICONDUCTORS AFTER FINAL POLISHING

CROSS-REFERENCE TO RELATED APPLICATIONS

This application claims the benefit of U.S. Provisional Application No. 60/149,123, filed Aug. 16, 1999 and U.S. Provisional Application No. 60/149,212, filed Aug. 17, 1999.

BACKGROUND OF THE INVENTION

The present invention relates generally to the cleaning of semiconductors, and more particularly to the cleaning of semiconductor (e.g., silicon) wafers after final polishing.

The manufacture of semiconductor wafers requires numerous processing operations including growing an ingot, slicing, lapping, grinding, etching, polishing and cleaning. The final polishing operation reduces the surface roughness of the wafer to a level acceptable for semiconductor device manufacturers (e.g., about 0.02 nm to about 0.5 nm based upon Atomic Force Microscopy of a 10 $\mu$m×10 $\mu$m field of view) while it increases the total thickness variation of the wafer by about 0.1 to about 1.5 $\mu$m (e.g., current detection limits are about 0.01 $\mu$m, for conventional capacitance measuring devices such as the ADE 7200 or ADE 9600), and it deposits contaminants such as particulate matter (e.g., silica polishing media), foreign metals (e.g., iron, zinc and aluminum), and organic compounds on the wafer surface. For example, a typical polished 200 mm wafer is estimated to have approximately 1 to 3 million particles exceeding about 0.2 $\mu$m in diameter on the surface. The foregoing particle count is an estimate because the extent of particle contamination after polishing is so great that conventional laser scanning counting devices such as the Tencor 6200, ADE CR80 or ADE CR81 cannot accurately determine counts above about 20,000 particles per wafer. A typical polished wafer also has about $1\times10^{15}$ metal atoms/cm$^2$ (as determined, for example, by Acid Drop Inductive Coupled Plasma Mass Spectroscopy), and at least about $5\times10^{15}$ organic carbon atoms/cm$^2$ (determined, for example, by Gas Chromatography/Atomic Emission Spectroscopy).

Current specifications for a Grade 1 wafer typically require that it have a concentration of contaminant particles exceeding 0.2 $\mu$m in diameter adsorbed to the wafer surface no greater than about 0.06 to about 0.16 particles/cm$^2$ (e.g., the front of a 200 mm diameter Grade 1 wafer has no more than about 50 particles exceeding about 0.2 $\mu$m in diameter); no more than about $1\times10^{10}$ metal atoms/cm$^2$; and no more than about $1\times10^{14}$ organic carbon atoms/cm$^2$. To achieve these target concentrations, therefore, the wafer must be subjected to a cleaning method with numerous cleaning methods being known in the art to reduce the concentration of surface contaminants (e.g., RCA cleaning, Piranha-RCA cleaning, megasonic and ultrasonic cleaning, scrubbing and acid etching).

To adequately clean the surface of a polished semiconductor wafer such that it is substantially free of contaminants (i.e., contamination no greater than the levels corresponding to a Grade 1 wafer), conventional manufacturing methods typically involve at least two cleaning operations after final polishing: a first post-polish cleaning operation followed by a final cleaning operation with the wafer being dried as the last step in the post-polish operation. During the post-polish cleaning operation which may, for example, comprise 10 or more steps (e.g., alkaline cleaning steps such as SC-1, acid cleaning steps such as hydrofluoric acid or SC-2, deionized water rinsing steps, and drying steps), the particle count on the front surface of a polished 200 mm wafer may be reduced to about 50 to about 3000 particles exceeding about 0.2 $\mu$m in diameter. During the final cleaning operation which may, for example, comprise another 10 or more steps (e.g., alkaline cleaning steps such as SC-1, acid cleaning steps such as hydrofluoric acid or SC-2, deionized water rinsing steps, and drying steps) the particle count on the front surface of a polished 200 mm wafer may be further reduced to about 15 or fewer particles exceeding about 0.2 $\mu$m in diameter.

Cleaning methods constitute a significant manufacturing cost. The major expenses associated with cleaning processes include capital expenditures for the cleaning and drying equipment and associated plumbing, heating and cooling equipment, robotic wafer handling apparatus, computerized control equipment, apparatus for storing and disposing of cleaning solutions, and the clean room space required for the apparatus. In addition, there is the cost of the cleaning solutions, high purity water and cost of heating and cooling and filtering the solutions, as well as the cost of storing and disposing of them. In view of environmental concerns and regulations, the cost of disposal of certain materials can be greater than the cost of the material being discarded. Additionally, because conventional post-polish cleaning methods are multi-operational in nature, many of the above expenses are further increased.

In view of the foregoing, a need continues to exist for a more efficient and economic method for polished wafers resulting in the surface being substantially free of contaminants. Such a process would reduce the manufacturing costs associated with the final cleaning of semiconductor wafers. In addition, such a process would decrease the amount of waste product emitted into the environment.

SUMMARY OF THE INVENTION

Among the several objects and features of the present invention may be noted the provision of method which reduces the final cleaning of a semiconductor wafer to a single operation; the provision of such a method which yields a semiconductor wafer surface substantially free of contaminants; the provision of such a method which prevents back-ups in the manufacturing process; the provision of such a method wherein manufacturing costs including capital expenditures and raw material expenditures are reduced; the provision of such a method wherein the amount of occupied manufacturing floor space is reduced; the provision of such a method wherein the time required for final cleaning is reduced; and the provision of such a method wherein the amount of waste which must be discarded is reduced.

Generally, the present invention is directed to a process for cleaning a polished silicon wafer. The starting polished wafer for this process will have a surface roughness less than about 0.5 nm, a total thickness variation less than about 3 $\mu$m, a surface concentration of contaminant particles exceeding about 0.2 $\mu$m in diameter adsorbed to the wafer surface greater than about 100 particles/cm$^2$, a surface concentration of foreign metals greater than about $1\times10^{15}$ atoms/cm$^2$, and a surface concentration of organic compounds greater than about $1\times10^{14}$ carbon atoms/cm$^2$. The process comprises:

(a) contacting the polished wafer with an aqueous solution comprising an oxidizing agent to oxidize organic carbon on the surface of the wafer, (b) after step (a), immersing the polished wafer in an alkaline cleaning solution in the presence of a megasonic field to reduce the surface concentration of contaminant particles exceeding 0.2 μm in diameter, (c) withdrawing the polished wafer from the alkaline cleaning solution and rinsing it with deionized water, (d) after step (c), immersing the polished wafer in an acidic cleaning solution to reduce the surface concentration of contaminant metal atoms, (e) withdrawing the polished wafer from the acidic cleaning solution and immersing it in an aqueous bath comprising ozone, and (f) after step (e), drying the polished wafer, the dried polished wafer having a surface roughness less than about 0.5 nm, a total thickness variation less than about 2 μm, a surface concentration of contaminant particles less than about 0.06 to about 0.16 particles/cm$^2$, a surface concentration of foreign metals less than about $1 \times 10^{10}$ atoms/cm$^2$, and a surface concentration of organic compounds less than about $1 \times 10^{14}$ carbon atoms/cm$^2$, the process being further characterized by the absence of a step in which the surface of the polished wafer is dried between steps (a) and (e).

Other objects and features of the present invention will be in part apparent and in part pointed out hereinafter.

BRIEF DESCRIPTION OF THE DRAWING

FIG. 2 is a flow chart which details an example of the steps, some of which are optional, that may be employed in accordance with the present invention to clean a contaminated semiconductor wafer following final polishing.

FIG. 3 is a table containing particle count data achieved by cleaning wafers with the method of the present invention.

FIG. 4 is a table containing metal atoms concentration data achieve by cleaning wafers with the method of the present invention.

FIG. 5 is a table containing concentration data for organic contaminants and ions achieved by cleaning wafers with the method of the present invention.

DETAILED DESCRIPTION OF THE INVENTION

Figure 1:
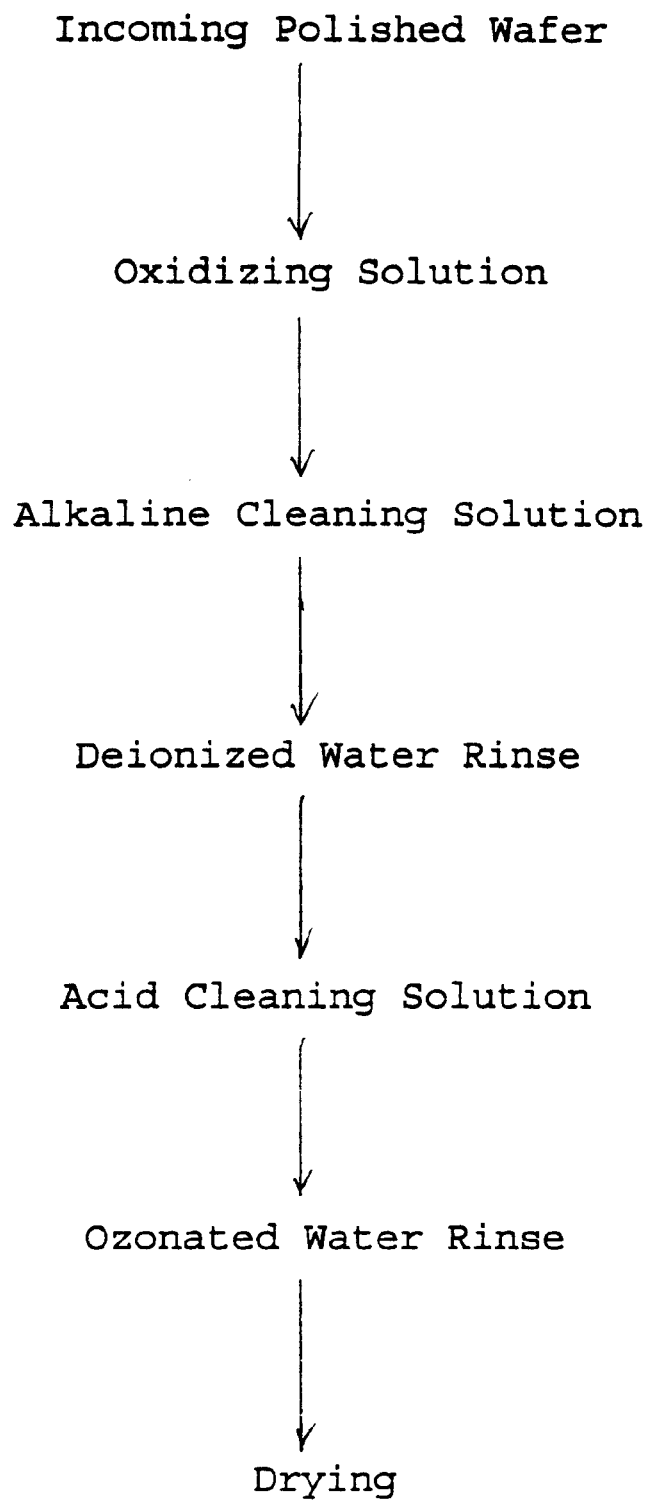
FIG. 1 is a flow chart which details an example of the steps employed in accordance with the present invention to clean a contaminated semiconductor wafer following final polishing.

The method of the present invention provides a means by which to readily and efficiently clean semiconductor wafers following final polishing. Referring generally to FIG. 1, in accordance with the present method, following final polishing, the surface of a contaminated semiconductor wafer is sequentially treated with an oxidizing solution, treated with an alkaline cleaning solution in the presence of a sonic field, rinsed with deionized water, treated with an acidic solution, treated with an ozonated water rinse, and dried. Advantageously, the method of the present invention cleans an incoming final polished semiconductor wafer in a single operation (i.e., following final polishing, a process or action is directed at the wafer which includes drying the wafer only once, thereby yielding a wafer substantially free from contaminants).

The term "contaminants" is to be understood as meaning, foreign metals, organic compounds, ions, and particulate having a diameter greater than about 0.2 μm adsorbed to the surface of a semiconductor wafer. Also, the method of the present invention, following final polishing, cleans a semiconductor wafer by oxidizing the wafer surface at the beginning of the operation and immediately prior to drying. In addition, compared to a multi-operation cleaning method, the method of the present invention reduces the manufacturing costs associated with the final cleaning of a semiconductor wafer, as well as reduces the amount of waste generated.

As discussed above, the current standard for particulate matter on a Grade 1 wafer is about 0.06 to about 0.1 particles exceeding 0.2 μm in diameter per cm$^2$ (about 40 to 100 particles on the front side of a 300 mm wafer). However, industry standards for cleanliness are increasing. For example, according the 1997 National Technology Roadmap (published by the Semiconductor Industry Association as a guidebook for silicon wafer, electronic device and equipment manufacturers), the particle size limits will continue to decrease through the year 2012. The suggested 1999 value is less than 60 particles exceeding 90 nm per 300 mm wafer, for 2006 the value is less than 27 particles exceeding 50 nm, and for 2012 the value is less than 22 particles exceeding 25 nm. The process of the present invention, although primarily concerned with particles exceeding about 0.2 μm (200 nm), is applicable to removing particles less than about 0.12 μm (120 nm), 0.09 μm (90 nm), and smaller. However, the current conventional detection limit for particles is greater than about 0.09 μm.

Accordingly, the process of the present invention is well-suited for the cleaning of semiconductor wafers, preferably silicon wafers having a nominal diameter of 150 mm, 200 mm, 300 mm or even greater diameters. The starting wafers are preferably single-side polished or double-side polished wafers and are characterized as follows: wet or dry, the surface roughness is generally less than about 0.5 nm, and typically about 0.02 to about 0.2 nm; the total thickness variation is generally less than about 3 μm, and typically about 0.2 to about 2 μm; the concentration of contaminant particles exceeding about 0.2 μm in diameter adsorbed to the wafer surface is generally greater than about 15 particles/cm$^2$, and typically greater than about 30 particles/cm$^2$, 150 particles/cm$^2$, or 3,000 particles/cm$^2$; the concentration of metals adsorbed to the wafer surface is generally greater than about $5 \times 10^{10}$ atoms/cm$^2$, and typically greater than about $10 \times 10^{10}$ atoms/cm$^2$, or $1 \times 10^{15}$ atoms/cm$^2$; the concentration of organic compounds adsorbed to the wafer surface is generally greater than about $1 \times 10^{14}$ carbon atoms/cm$^2$, and typically greater than about $2 \times 10^{14}$ carbon atoms/cm$^2$, or about $5 \times 10^{15}$ carbon atoms/cm$^2$.

Oxidation of the Wafer

Preferably, the process of the present invention begins by treating a polished wafer with an oxidizing solution. It is preferred that this step be carried out before the alkaline and acidic cleaning steps of the present invention; the alkaline and acidic cleaning steps are not particularly well-suited for the removal of organic contaminants and may even be hampered by organic compounds on the wafer surface.

Preferably, the oxidizing solution is capable of reducing the concentration of organic contaminants on the wafer surface. Additionally, the oxidizing compound is preferably capable of creating an oxide layer on the surface of the wafer of sufficient thickness to prevent direct silicon etching by subsequent alkaline washing solution steps (i.e., a layer of silicon oxide preferably remains on the wafer surface throughout the entire period the wafer is in contact with an alkaline solution). Conventionally, after final polishing, a silicon wafer does not have an oxide layer on the surface which results in a hydrophobic surface. If an alkaline solution contacts the hydrophobic surface of the wafer, it tends to excessively etch the wafer surface causing roughening and pitting. In contrast, silicon oxide is hydrophillic, its alkaline etch removal rate is about 1000 times slower than silicon, and as a result the etching process is readily controlled. Typically, following final polishing, surfactants are adsorbed to the wafer surface. The surfactants make the surface of the wafer appear to be hydrophillic, however, they are quickly removed by alkaline solutions and the bare silicon wafer is excessively etched. Thus, an oxidized layer is preferably built up on the wafer prior to contact with the alkaline solution.

Preferably, the solution comprises an oxidizing compound with sufficient oxidizing ability, for example, ozone, peroxydisulfuric acid (generally created by heating sulfuric acid with oxidants such as hydrogen peroxide, nitric acid or ozone and commonly referred to as a Piranha process), permanganate, chromate, oxygen-halogen compounds such as perchlorate (hereinafter referred to as "oxy-halides"), and/or oxalic acid. However, the oxidizing solution preferably does not contain significant quantities of sulfur, organic compounds or metals which tend to increase the concentration of contaminants on the wafer surface.

The oxidizing solution preferably comprises ozonated water. More preferably, the concentration of ozone is at least about 10 ppm. Because as the temperature of the water increases the saturation concentration decreases, the temperature of the ozonated water is preferably less than about 35° C., more preferably less than about 30° C., and still more preferably about 17 to about 25° C. At about 17 to about 25° C., the saturation concentration is about 30 to about 35 ppm, thus, preferably the concentration of ozone is maintained at least about ⅓ of saturation which corresponds to about 10 ppm. More preferably, the concentration of ozone is maintained at about 50% of saturation, still more preferably at least about 70%, still more preferably at least about 90%, and still more preferably at about 100%. Additionally, by using methods known in the art, supersaturation of ozone can be achieved and may be preferred.

The amount of time the wafer is exposed to the ozonated water is primarily a function of the amount of contamination and the concentration of dissolved ozone. Preferably, the duration of the wash is about 5 to about 30 minutes, and more preferably about 6 to about 8 minutes. Ultimately, however, the wafer is treated with the ozone wash for as long as necessary to sufficiently clean the wafer. For example, a wax mounted polishing operation results in a relatively large amount of organic contaminants adhered to the wafer surface and can require, for example, up to about 30 minutes in the wash. In comparison, a non-wax mounted polished wafer may only require about 6 to about 8 minutes in the wash.

If it is desirable to treat the wafer for a period exceeding about 8 to about 10 minutes in the ozonated water wash, it is preferred that oxidation of the wafer is accomplished in two or more steps. That is, the wafer is oxidized in sequential ozonated water baths preferably not exceeding about 8 to about 10 minutes, and more preferably about 6 to about 8 minutes. A multi-step wash increases throughput and prevents a bottleneck in the manufacturing process resulting from substantially different treatment durations for consecutive treatments. For example, a 6 minute treatment followed by a 20 minute treatment will result in a back-up of wafers in the manufacturing process. To further prevent back-ups, preferably the duration of each bath in the sequence is approximately equal. The multi-step wash can be in the form of multiple tanks, a single tank with sufficient length to accommodate multiple steps. However, an even more preferable method of preventing back-ups is using a smaller pitch, or space between wafers in the carrier, to increase the throughput (e.g., typically, 300 mm wafers are spaced about 10 mm apart, but to increase throughput the distance between the wafers, or pitch, can be reduced to about 5 mm). Thus, by using a 3 pitch (e.g., 5 mm instead of 10 mm), twice as many wafers can be processed in the same amount of time without increasing the number of baths or the length of the baths.

Although the wafers may be treated with the ozonated water in a variety of manners (e.g., spraying, recirculated bath or overflow bath), it is preferred that the wafers be fully immersed in a recirculated and filtered bath (to reduce raw material costs and increase the cleaning efficiency by removing contaminants suspended in the bath). Due to the inefficiency of current methods of dissolving ozone into water, recirculation is an easy way to increase the ozone to saturation. Other methods of treatment, such as spraying, generally are less preferred because the dissolved ozone more readily comes out of solution.

After the ozonated water wash, the oxide layer is preferably at least about 4 Å thick, more preferably at least about 5 Å, and still more preferably about 6 to about 10 Å. Also, the concentration of organic contaminants on the wafer after the wash is preferably less than $5 \times 10^{15}$ carbon atoms/cm$^2$, more preferably less than $1 \times 10^{15}$ carbon atoms/cm$^2$, and still more preferably less than the detection limit for organic carbon (the detection limit of current equipment is about $1 \times 10^{10}$ carbon atoms/cm$^2$, however, due to the high affinity between silicon and organic compounds, the practical detection limit for a silicon wafer is about $1 \times 10^{11}$ carbon atoms/cm$^2$).

Alkaline Cleaning

Following the ozone wash, the wafer surface is treated with an alkaline solution in the presence of a sonic field which is capable of decreasing the amount of contaminants adsorbed to the wafer surface without directly etching non-oxidized wafer material, increasing the surface roughness of the wafer above about 0.01 nm, or detectably increasing the total thickness variation (the current detection limits for a change in thickness variation is about 0.01 μm).

Preferably, the alkaline cleaning solution comprises hydroxyl ions, hydrogen peroxide and deionized water. Preferably, the source of the hydroxyl ions is ammonium hydroxide and/or alkyl ammonium hydroxides such as tetra-methyl-ammonium hydroxide (TMAH) and tetra-ethyl-ammonium hydroxide. More preferably, the alkaline cleaning solution consists essentially of ammonium hydroxide, hydrogen peroxide and deionized water. The ratio of ammonium hydroxide, hydrogen peroxide and water range, respectively, from about 1:2:300 to about 1:10:20 by volume of commercially available reagent solutions, typically supplied as 28–30 wt % $NH_4OH$ in water and as 30–35 wt % $H_2O_2$ in water. The ratios of ammonium hydroxide and hydrogen peroxide are expressed relative to water, but independent of each other. That is, in the solution described about, the ratio of $NH_4OH:H_2O$ ranges from about 1:300 to about 1:20, the ratio of $H_2O_2:H_2O$ is about 1:150 to about 1:2, and both of these ratios ($NH_4OH:H_2O$ and $H_2O_2:H_2O$) are independent of each other. Expressed in Molarity, the concentration of ammonium hydroxide is less than about 2 moles per liter of water, and more preferably about 0.2 to about 0.5 moles per liter of water. Preferably, the concentration of hydrogen peroxide is less than about 2 moles per liter of water, and more preferably about 0.3 to about 1.0 moles per liter of water.

It is well known in the art that hydrogen peroxide oxidizes silicon and ammonium hydroxide etches both silicon and silicon oxide. As discussed above it is preferred that silicon not be etched directly, thus, preferably the ratio of ammonium hydroxide to hydrogen peroxide is such that silicon beneath the oxidized layer is not directly etched. More preferably, the ratio is maintained such that oxidation rate, in terms of oxide layer thickness, is at least about equal to the silicon oxide removal rate, and still more preferably the oxidation rate exceeds the silicon oxide removal rate. Preferably, the volume ratio (using commercially available solutions) of $NH_4OH:H_2O_2$ is about 1:1 to about 1:10, and more preferably about 1:2 to about 1:5.

Although the combination of hydrogen peroxide and ammonium hydroxide are effective at removing particulate and foreign metal contaminants, it is preferred that the alkaline solution be assisted by introducing energy in the form of sound waves into the alkaline bath. In this technique, highly effective non-contact scrubbing action on both front and back sides of a wafer is achieved by extremely high-frequency sonic energy while the wafer is submerged in the solution. See U.S. Pat. No. 5,919,311. Preferably, the sonic energy is megasonic, having a frequency of about 0.8 to about 2 MHZ. Conventionally, megasonic sound waves are generated by an array of piezoelectric transducers mounted to the bath wall. Particles ranging in size from several micrometers down to about 0.2 $\mu$m and smaller are efficiently removed with energy input of at least about 3 watts per 200 mm wafer. Although it is not uncommon for megasonic energy input to be about 50 watts per 200 mm wafer, no significant improvement in cleaning is observed for energy input levels above about 3 watts per 200 mm wafer. Preferably, the energy input level is maintained at about 3 to about 20 watts per 200 mm wafer. Thus, a tank designed to handle a loaded 25 wafer carrier will preferably have an energy input level of about 75 to about 1500 watts. For wafers of different diameter, the energy input is adjusted based on watts per unit surface area to an equivalent energy level. However, the total power supplied to the megasonic transducers will generally need to be greater than the total power being applied to the bath in which the wafers are situated due to operational constraints, heat losses and other inefficiencies associated with the various megasonic cleaning apparatus. For example, the power supplied to a megasonic cleaning apparatus rated at 300 W is typically limited to about 90% of its rated power—about 270 W. Assuming that heat losses and other inefficiencies associated with this type of apparatus further reduce the delivered power by a factor of about 20%, the power supplied to the bath would be about 216 W and the megasonic power applied to twenty-five wafers in the bath would be about 9 W per wafer. The wafer is preferably oriented in the etching bath in a manner which allows for acoustic streaming of the solution over the oxide layer (i.e., the front wafer surface is parallel to the direction in which the sound waves are transmitted through the solution).

The temperature of the alkaline cleaning solution is preferably at about 45 to about 75° C., more preferably about 55 to about 70° C., and still more preferably about 65° C. Also, it is preferred that the alkaline cleaning solution be recirculated and filtered (to reduce raw material costs and increase the cleaning efficiency by removing contaminants suspended in the bath).

According to the present invention, the wafer is treated in the megasonic alkaline cleaning solution for at least as long as necessary to remove substantially all of the particulate contaminant. Typically, a wafer immersed in a single-step alkaline solution is substantially free of particulate contaminants after about 20 to about 21 minutes. However, a shorter duration may be adequate for a less contaminated wafer.

To increase the efficiency of the cleaning process, if it is desirable to treat the wafer for a period exceeding about 8 to about 10 minutes in the alkaline solution, it is preferred that the wafer is immersed in two or more megasonic alkaline solution baths. Preferably the duration of each bath does not exceed about 8 to about 10 minutes each; and more preferably the duration of each bath is about 6 to about 8 minutes. To further prevent back-ups, the duration of each bath in the sequence is preferably about equal. Even more preferably, the wafer is immersed in two alkaline solution baths for about 6 to 8 minutes each. For reasons not yet fully understood, it has been observed that cleaning a wafer in two alkaline solution baths for a total duration of about 12 to about 16 minutes yields a wafer surface at least as clean as about 20 to about 21 minutes in a single alkaline solution bath. If additional throughput is required, a preferable method of increasing the number of wafers cleaned per hour is using a smaller pitch, or space between wafers in the carrier, instead of more than two alkaline cleaning solution baths.

Following megasonic alkaline cleaning, concentration of particles exceeding 0.2 $\mu$m in diameter on the wafer surface is preferably less than about 0.06 to about 0.16 particles/$cm^2$, and more preferably less than about 0.04 particles/$cm^2$.

Deionized Water Rinse

Following alkaline cleaning, the wafer surface is rinsed with deionized water. The deionized water rinse assists in the removal of contaminants on the wafer surface and removes residual amounts of previous treatment solutions (e.g., ammonium hydroxide or acid). If two or more megasonic alkaline solution baths are used, it is preferred to follow the first alkaline bath with a deionized water rinse in addition to a rinse following the final alkaline solution bath.

Preferably, the temperature of the deionized water rinse is about 17 to about 25° C., and the wafer is rinsed by a technique commonly referred to as a Quick Dump Rinse. The Quick Dump Rinse process comprises placing a wafer in a tank filled with deionized water; as soon as the wafer is completely immersed, quick dump valves at the bottom of the tank are opened and the water rapidly flows from the tank; when the quick dump valves are opened the wafers are also sprayed with deionized water; when the tank is empty, the quick dump valves are closed and deionized water is pumped into the tank and the spray continues until the tank is full. Conventionally, the total dump time is about 2 seconds and the fill time is less than about 1 minute. Preferably, the fill time is about 30 seconds or less. Thus, the fill rate for the tank is preferably at least about the volume of the tank per minute, and more preferably twice the volume of the tank per minute. For example, a typical Quick Dump Rinse tank has a volume of about 35 to about 50 liters, thus, the fill rate is preferably about 35 to 50 liters/minute, and more preferably about 70 to about 100 liters/minute. Preferably, the deionized water rinse comprises at least 2 Quick Dump Rinses, and more preferably 2 to 7 Quick Dump Rinses.

Acidic Cleaning

Following the deionized water rinse which follows alkaline cleaning, the wafer surface is treated with an acidic solution. The primary purpose of the acid solution is to further remove metal contamination without adding contaminants to the wafer surface.

The acid solution preferably comprises acid and deionized water to preferably extract metals from the silicon oxide on the wafer surface without directly etching the oxide or underlying silicon. Preferably, the acid is selected from the group consisting of nitric acid, citric acid, hydrochloric acid, and mixtures thereof. More preferably, the acid is hydrochloric acid. Preferably, the concentration of acid is less than about 2 moles per liter of water, and more preferably about 0.01 to about 0.2 moles per liter of water. If desired (e.g., to further oxidize the surface and remove organics), an oxidizing agent such as hydrogen peroxide and/or ozone may also be included in the acid solution. Preferably, the concentration of hydrogen peroxide is less than about 2 moles per liter.

Preferably, the temperature of the acid solution is about 17 to about 95° C., and more preferably about 25° C. to about 70° C. Preferably, the wafer is treated in the acid solution for at least as long as necessary to remove substantially all of the foreign metal contaminants. The amount of time required to adequately treat the wafer surface with the acid solution is largely a function of metal contaminant concentration and solution temperature. In general, the duration of the acid solution treatment increases with increasing contamination concentration and/or decreasing acid solution temperature. Preferably, the duration of the acid wash is about 4 to about 10 minutes, and more preferably about 5 to about 8 minutes.

Although the wafers may be treated with the acid solution in a variety of manners (e.g., spraying, recirculated bath, or ozone bath), it is preferred that the wafers be fully immersed in a recirculated and filtered bath (to reduce raw material costs and increase the cleaning efficiency by removing contaminants suspended in the bath).

After acid cleaning, the wafer preferably has less than about $1 \times 10^{10}$ metal atoms/cm$^2$. More preferably, the concentration for each type of metal (e.g., iron, zinc and aluminum) is than about $1 \times 10^{10}$ atoms/cm$^2$.

Deionized Water Rinse

In a preferred embodiment of the present invention, the acid cleaning is followed by a deionized water rinse carried out in the same manner as the deionized rinse which follows the alkaline cleaning.

Ozonated Water Rinse

Following acid cleaning, the surface of the wafer is treated with ozonated deionized water to remove residual acid solution, residual organic contaminants and ions such as ammonium which may have been adsorbed to the wafer during the preceding cleaning steps.

The wafer may be treated with the ozonated water in a variety of manners (e.g., spraying, recirculated bath, overflow bath), however, the wafers are preferably immersed in an overflow bath which ensures the highest degree of wafer cleanliness. Conventionally, rinsing a carrier of wafers in an ozonated water overflow bath entails immersing the wafers in a tank containing ozonated water; while immersed, the to wafers are oxidized which removes contaminants; to increase the cleaning efficiency, fresh ozonated water is continually pumped into the tank; once the tank is full, ozonated water overflows the tank and contaminants suspended in the water are removed from the tank and cannot be redeposited on the wafers.

Preferably, the concentration of ozone is at least about 1 ppm, more preferably about 1 to about 5 ppm, and still more preferably about 5 to about 15 ppm. Most preferably, the concentration of ozone is about saturation. However, due to the inefficiency of current methods of dissolving ozone into water, an ozone concentration approaching saturation is currently not attainable without recirculation. Thus, the concentration of ozone attainable in a conventional overflow bath is significantly less than saturation (e.g., less than about 50% saturation). The temperature of the ozonated water is preferably less than about 35° C., more preferably less than about 30° C., and still more preferably about 17 to about 25° C.

The amount of time the wafer is exposed to the ozonated water is primarily a function of the amount of contamination and the concentration of dissolved ozone. Preferably, the wafer is rinsed in the ozonated water for at least as long as necessary to remove substantially all of the residual organic and ion contaminants—typically about 5 to about 8 minutes.

Drying the Wafer

Following the ozonated water rinse, the wafer is dried by any acceptable method known in the art such as spin drying or IPA (drying with the aid of isopropyl alcohol), preferably by IPA drying. In general, IPA drying entails contacting a wet wafer with isopropyl alcohol, which is miscible in water. The alcohol decreases the surface tension of water which decreases the contact angle between the water and causes the water to roll off the wafer surface and the remaining alcohol evaporates.

There are three generally recognized methods of IPA drying: 1) Marangoni drying which entails pulling a wafer, submerged in water, through a water/isopropyl alcohol interface created by spraying alcohol across the top of the water; 2) Vapor Jet® by SCP Global Technology which dries the wafer by blowing nitrogen gas with about 1 to 2% isopropyl alcohol on the wafer surface; and 3) Vapor drying which entails placing a carrier full of wafers in a cloud of heated isopropyl alcohol vapor, alcohol condenses on the wafers, mixes with the water, and the water rolls of the wafer. Any of the foregoing IPA methods may be used, however, there are benefits and disadvantages associated with each. For example, Marangoni and Vapor Jets generally use significantly less alcohol than Vapor. Also, Marangoni and Vapor Jet® are generally slower than Vapor, and as a result, two or three dryers are usually necessary to avoid back-ups. Lastly, Marangoni and Vapor Jet® tend to leave water spots. In view of the foregoing, the wafer is preferably dried using the IPA Vapor method. Preferably, the temperature of the cloud is about 80 to about 85° C. Preferably, the wafers are left in is the cloud until they reach the temperature of the cloud, typically, about 3 to about 10 minutes. However, if a low mass carrier is used the time can be reduced to about 2 to about 5 minutes.

Following the drying step, preferably at least about 98% of the wafers cleaned according to the method of the present invention qualify as Grade 1 wafers, and more preferably at least about 99%. After a wafer is cleaned with the single-operation cleaning method of the present invention, the wafer surface is substantially free of contaminants. More specifically, concentration of foreign metals on the wafer surface is less than about $1 \times 10^{10}$ atoms/cm$^2$. The concentration of particulate exceeding 0.02 $\mu$m in diameter is less than about 0.06 to about 0.16 particles/cm$^2$, and preferably less than about 0.04 particles/cm$^2$. The concentration of particulate exceeding 0.12 $\mu$m in diameter is less than about 0.13 particles/cm$^2$, and preferably less than 0.10 particles/cm$^2$. The concentration of organic contaminants is less than about $1 \times 10^{14}$ carbon atoms/cm$^2$, preferably less than about 0.1 to $0.5 \times 10^{14}$ carbon atoms/cm$^2$, and more preferably less than about $1 \times 10^{11}$ carbon atoms/cm. Lastly, the cleaning method of the present invention effectively removes all other ions such as ammonia so that degradation haze preferably does not occur. Additionally, the surface roughness is about 0.02 to 0.5 nm and the total thickness variation is about 0.02 to about 2 $\mu$m.

When introducing elements of the present invention or the preferred embodiment(s) thereof, the articles "a", "an", "the" and "said" are intended to mean that there are one or more of the elements. The terms "comprising", "including"

and "having" are intended to be inclusive and mean that there may be additional elements other than the listed elements.

The present invention is further illustrated by the following example which is merely for the purpose of illustration and is not to be regarded as limiting the scope of the invention or manner in which it may be practiced.

EXAMPLE

Referring generally to FIG. 2, twenty-six incoming 300 mm wafers were sequentially immersed in a recirculated ozone water bath having an ozone concentration of 25 ppm for 9 min; immersed in a recirculated megasonic alkaline solution bath at 65° C., 500 W energy input, for 8 min. 40 sec.; rinsed with 6 Quick Dump Rinses; immersed in a recirculated megasonic alkaline solution bath at 65° C., 500 W energy input, for 8 min.; rinsed with 6 Quick Dump Rinses; immersed in a recirculated acid solution at 70° C. for 7 min. 20 sec; rinsed with 6 Quick Dump Rinses; immersed in an ozonated water overflow bath having an ozone concentration of 5 ppm for 6 min. 20 sec.; dried in an IPA Vapor dryer for 5 min. 30 sec. Throughout testing, the alkaline solutions were maintained at about 0.44M±15% $NH_4OH$ and 0.88M±15% $H_2O_2$, and the acid solution was maintained at about 0.16 M±15% HCl. The data found in FIGS. 3–5 indicate that final polished wafers cleaned with the method of the present invention have an average level of surface contamination which meets or exceeds the current Grade 1 standard. Additionally, the average level of surface ions is sufficiently low that no degradation haze is observed after a four day rapid haze test which entails exposing a wafer to a closed atmosphere in the presence of 10 mL of water sequentially for 24 hours at about 50° C., 24 hours at about −5° C., 48 hours at room temperature (about 25° C.), and inspecting the surface of the wafer for a change in the number of particles exceeding 0.12 μm.

In view of the above, it will be seen that the several objects of the invention are achieved and other advantageous results attained. It is intended that all matter contained in the above description shall be interpreted as illustrative and not in a limiting sense.

What is claimed is:

1. A process for cleaning a semiconductor wafer after it is polished, the polished semiconductor wafer having a surface roughness less than about 0.5 nm, a total thickness variation less than about 3 μm, a surface concentration of contaminant particles (exceeding about 0.2 mm in diameter adsorbed to the wafer surface) greater than about 15 particles/cm², said contaminant particles being greater than about 0.2 μm in diameter, a surface concentration of foreign metals greater than about $1\times10^{15}$ atoms/cm², a surface concentration of organic compounds greater than about $1\times10^{14}$ carbon atoms/cm², the process comprising:

(a) contacting the polished semiconductor wafer with an aqueous solution comprising an oxidizing agent to oxidize organic carbon on the surface of the semiconductor wafer, (b) after step (a), immersing the polished semiconductor wafer in an alkaline cleaning solution in the presence of a megasonic field to reduce the surface concentration of said contaminant particles exceeding 0.2 μm in diameter, (c) withdrawing the polished semiconductor wafer from the alkaline cleaning solution and rinsing it with deionized water, (d) after step (c), immersing the polished semiconductor wafer in an acidic cleaning solution to reduce the surface concentration of said foreign metals, (e) withdrawing the polished semiconductor wafer from the acidic cleaning solution and immersing it in an aqueous bath comprising ozone, and (f) after step (e), drying the polished semiconductor wafer, the dried polished semiconductor wafer having a surface roughness less than about 0.5 nm, a total thickness variation less than about 2 μm, a surface concentration of contaminant particles less than about 0.06 to about 0.16 particles/cm², said contaminant particles being greater than about 0.2 μm in diameter, a surface concentration of foreign metals less than about $1\times10^{10}$ atoms/cm², and a surface concentration of organic compounds less than about $1\times10^{14}$ carbon atoms/cm², the process being further characterized by the absence of a step in which the surface of the polished semiconductor wafer is dried between steps (a) and (e).

2. The process as set forth in claim 1 wherein the dried polished semiconductor wafer has a surface concentration of contaminant particles less than about 0.04 particles/cm².

3. The process as set forth in claim 1 wherein the dried polished semiconductor wafer has a surface concentration of organic compounds less than about $1\times10^{11}$ carbon atoms/cm².

4. The process as set forth in claim 1 wherein the dried polished semiconductor wafer has a surface concentration of less than about $1\times10^{10}$ atoms/cm² for each of said foreign metals selected from the group consisting of iron, zinc and aluminum.

5. The process as set forth in claim 1 wherein degradation haze is not observed on the dried polished semiconductor wafer.

6. The process as set forth in claim 1 wherein step (a) creates an oxide layer on the surface of the polished semiconductor wafer of sufficient thickness to prevent direct silicon etching by step (b).

7. The process as set forth in claim 1 wherein the oxidizing agent comprises ozone.

8. The process as set forth in claim 1 wherein the oxidizing agent comprises ozone having a concentration in the aqueous solution of at least about 10 ppm.

9. The process as set forth in claim 1 wherein the oxidizing agent comprises ozone having a concentration in the aqueous solution of at least about ⅓ the saturation concentration of the ozone in the aqueous solution wherein the saturation concentration is about 30 to about 35 ppm.

10. The process as set forth in claim 1 wherein the oxidizing agent comprises ozone having a concentration in the aqueous solution of at least about 50% of the saturation concentration of the ozone in the aqueous solution wherein the saturation concentration is about 30 to about 35 ppm.

11. The process as set forth in claim 1 wherein the oxidizing agent comprises ozone having a concentration in the aqueous solution of at least about 70% of the saturation concentration of the ozone in the aqueous solution wherein the saturation concentration is about 30 to about 35 ppm.

12. The process as set forth in claim 1 wherein the oxidizing agent comprises ozone having a concentration in the aqueous solution of at least about 90% of the saturation concentration of the ozone in the aqueous solution wherein the saturation concentration is about 30 to about 35 ppm.

13. The process as set forth in claim 1 wherein the oxidizing agent comprises ozone having a concentration in the aqueous solution of about the saturation concentration or above the saturation concentration of the ozone in the aqueous solution wherein the saturation concentration is about 30 to about 35 ppm.

14. The process as set forth in claim 1 wherein the duration of step (a) is about 5 to about 30 minutes.

15. The process as set forth in claim 1 wherein the duration of step (a) is about 6 to about 8 minutes.

16. The process as set forth in claim 1 wherein step (a) is accomplished by sequential baths.

17. The process as set forth in claim 1 wherein the alkaline cleaning solution comprises hydroxyl ions, hydrogen peroxide and deionized water.

18. The process as set forth in claim 1 wherein the alkaline cleaning solution consists essentially of ammonium hydroxide, hydrogen peroxide and deionized water.

19. The process as set forth in claim 18 wherein the temperature of the alkaline cleaning solution is about 45 to about 75° C.

20. The process as set forth in claim 1 wherein the duration of step (b) is about 20 to about 21 minutes.

21. The process as set forth in claim 1 wherein stop (b) is accomplished by a first and a final alkaline cleaning solution bath.

22. The process as set forth in claim 1 wherein step (c) is comprises at least 2 quick dump rinses.

23. The process as set forth in claim 1 wherein step (c) comprises 2 to 7 quick dump rinses.

24. The process as set forth in claim 1 wherein the acidic cleaning solution comprises acid and deionized water.

25. The process as set forth in claim 1 wherein the temperature of the acidic cleaning solution is about 17 to about 95° C.

26. The process as set forth in claim 1 wherein the duration of step (d) is about 4 to about 10 minutes.

27. The process as set forth in claim 1 wherein the duration of step (d) is about 5 to about 8 minutes.

28. The process as set forth in claim 1 wherein after withdrawing the semiconductor wafer from the acidic cleaning solution and prior to immersing it in the aqueous bath comprising ozone, the semiconductor wafer is rinsed with deionized water.

29. The process as set forth in claim 1 wherein the aqueous bath of step (e) is an overflow bath.

30. The process as set forth in claim 1 wherein the concentration of ozone in the aqueous bath of step (a) is at least about 1 ppm.

31. The process as set forth in claim 1 wherein the concentration of ozone in the aqueous bath of step (e) is about 1 to about 5 ppm.

32. The process as set forth in claim 1 wherein the concentration of ozone in the aqueous bath of step (e) is about 5 to about 15 ppm.

33. The process as set forth in claim 1 wherein the duration of step (e) is about 5 to about 8 minutes.

34. The process as set forth in claim 1 wherein the semiconductor wafer is dried by IPA Drying.

35. The process set forth in claim 1 wherein the semiconductor wafer is dried by IPA Vapor drying.

36. The process as set forth in claim 6 wherein the oxide layer is at least about 4 Å.

37. The process as set forth in claim 6 wherein the oxide layer is at least about 5 Å.

38. The process as set forth in claim 6 wherein the oxide layer is at about 6 to 10 Å.

39. The process as set forth in claim 16 wherein the duration of each bath does not exceed about 8 to about 10 minutes.

40. The process as set forth in claim 16 wherein the duration of each bath is about 6 to about 8 minutes.

41. The process as set forth in claim 18, wherein the concentration of ammonium hydroxide is less than 2 moles per liter of water and the concentration of hydrogen peroxide is less than 2 moles per liter of water.

42. The process as set forth in claim 18 wherein the concentration of ammonium hydroxide is about 0.2 to about 0.5 moles per liter of water and the concentration of hydrogen peroxide is about 0.3 to about 1.0 moles per liter of water.

43. The process as set forth in claim 18 wherein the ratio of ammonia hydroxide to hydrogen peroxide corresponds to the volume ratio of about 1:1 to about 1:10 when using commercially available reagent solutions of about 28–30 wt % $NH_4OH$ in water and about 30–35 wt % $H_2O_2$ in water.

44. The process as set forth in claim 18 wherein the ratio of ammonia hydroxide to hydrogen peroxide corresponds to the volume ratio of about 1:2 to about 1:5 when using commercially available reagent solutions of about 28–30 wt % $NH_4OH$ in water and about 30–35 wt % $H_2O_2$ in water.

45. The process as set forth in claim 21 wherein the duration of each bath does not exceed about 8 to about 10 minutes.

46. The process as set forth in claim 21 wherein the duration of each bath is about 6 to about 8 minutes.

47. The process as set forth in claim 30 wherein step (c) is performed following the first and the final alkaline cleaning solution bath.

48. The process as set forth in claim 24 wherein the acid is selected from the group consisting of nitric acid, citric acid, hydrochloric acid and mixtures thereof.

49. The process as set forth in claim 26 wherein the acidic cleaning solution further comprises an oxidizing agent.

50. The process as set forth in claim 48 wherein the concentration of acid in the acidic cleaning solution is less than about 2 moles per liter of water.

51. The process as set forth in claim 48 wherein the concentration of acid in the acidic cleaning solution is about 0.01 to about 0.2 moles per liter of water.

52. The process as set forth in claim 49 wherein the acidic cleaning solution oxidizing agent is selected from the group consisting of hydrogen peroxide, ozone and mixtures thereof.

53. A process for cleaning a semiconductor wafer after it is polished, the polished semiconductor wafer having a surface roughness less than about 0.5 nm, a total thickness variation less than about 3 µm, a surface concentration of contaminant particles greater than about 15 particles/$cm^2$, said contaminant particles being greater than about 0.2 µm in diameter, a surface concentration of foreign metals greater than about $1\times10^{15}$ atoms/$cm^2$, a surface concentration of organic compounds greater than about $1\times10^{14}$ carbon atoms/$cm^2$, the process comprising:

(a) contacting the polished semiconductor wafer with an aqueous solution comprising an oxidizing agent to oxidize organic carbon on the surface of the semiconductor wafer, (b) after step (a), immersing the polished semiconductor wafer in a first alkaline cleaning solution in the presence of a first megasonic field to reduce the surface concentration of said contaminant particles exceeding 0.2 µm in diameter, (c) withdrawing the polished semiconductor wafer from the first alkaline cleaning solution and rinsing it with deionized water, (d) after step (c), immersing the polished semiconductor wafer in a second alkaline cleaning solution in the presence of a second megasonic field, (e) withdrawing the polished semiconductor wafer from the second alkaline cleaning solution and rinsing it with deionized water, (f) after step (e), immersing the polished semiconductor wafer in an acidic cleaning solution to reduce the surface concentration of said foreign metals, (g) withdrawing the polished semiconductor wafer from the acidic cleaning solution and immersing it in an aqueous bath comprising ozone, and (h) after step (g), drying the polished semiconductor wafer, the dried polished semiconductor wafer having a surface roughness less than about 0.5 nm, a total thickness variation less than about 2 μm, a surface concentration of contaminant particles less than about 0.06 to about 0.16 particles/cm$^2$, said contaminant particles being greater than about 0.2 μm in diameter, a surface concentration of foreign metals less than about 1×10$^{10}$ atoms/cm$^2$, and a surface concentration of organic compounds less than about 1×10$^{14}$ carbon atoms/cm$^2$, the process being further characterized by the absence of a step in which the surface of the polished semiconductor wafer is dried between steps (a) and (g).

54. A process for cleaning a semiconductor wafer after it is polished, the polished semiconductor wafer having a surface roughness less than about 0.5 nm, a total thickness variation less than about 3 μm, a surface concentration of contaminant particles greater than about 15 particles/cm$^2$, said contaminant particles being greater than about 0.2 μm in diameter, a surface concentration of foreign metals greater than about 1×10$^{15}$ atoms/cm$^2$, a surface concentration of organic compounds greater than about 1×10$^{14}$ carbon atoms/cm$^2$, the process comprising:

(a) contacting the polished semiconductor wafer with an aqueous solution comprising an oxidizing agent to oxidize organic carbon on the surface of the semiconductor wafer, (b) after step (a), immersing the polished semiconductor wafer in a first alkaline cleaning solution in the presence of a first megasonic field to reduce the surface concentration of said contaminant particles exceeding 0.2 μm in diameter, (c) withdrawing the polished semiconductor water from the first alkaline cleaning solution and rinsing it with deionized water, (d) after step (c), immersing the polished semiconductor water in a second alkaline cleaning solution in the presence of a second megasonic field, (e) withdrawing the polished semiconductor wafer from the second alkaline cleaning solution and rinsing it with deionized water, (f) after step (e), immersing the polished semiconductor wafer in an acidic cleaning solution to reduce the surface concentration of said foreign metals, (g) withdrawing the polished semiconductor wafer from the acidic cleaning solution and rinsing it with deionized water, (h) after stop (g), immersing the polished semiconductor wafer in an aqueous bath comprising ozone, and (i) after step (h), drying the polished semiconductor wafer, the dried polished semiconductor wafer having a surface roughness less than about 0.5 nm, a total thickness variation less than about 2 μm, a surface concentration of contaminant particles less than about 0.06 to about 0.16 particles/cm$^2$, said contaminant particles being greater than about 0.2 μm in diameter, a surface concentration of foreign metals less than about 1×10$^{10}$ atoms/cm$^2$, and a surface concentration of organic compounds less than about 1×10$^{14}$ carbon atoms/cm$^2$, the process being further characterized by the absence of a step in which the surface of the polished semiconductor wafer is dried between steps (a) and (h).

* * * * *

UNITED STATES PATENT AND TRADEMARK OFFICE
CERTIFICATE OF CORRECTION

PATENT NO. : 6,230,720 B1
DATED : May 15, 2001
INVENTOR(S) : M. Rao Yalamanchili, Kari B. Myli and Larry W. Shive It is certified that error appears in the above-identified patent and that said Letters Patent is hereby corrected as shown below:

Column 11,
Line 46, delete "exceeding about 0.2 µm in diameter adsorbed to the wafer surface."

Column 13,
Line 11, "claim 18" should read -- claim 1 --.
Line 15, "stop (b)" should read -- step (b) --.
Line 18, delete "is".
Line 39, "step (a)" should read -- step (e) --.
Line 51, "process set" should read -- process as set --.

Column 14,
Line 21, "claim 30" should read -- claim 21 --.
Line 27, "claim 26" should read -- claim 24 --.

Column 16,
Line 21, "stop (g)" should read -- step (g) --.

Signed and Sealed this

Twentieth Day of May, 2003

JAMES E. ROGAN
*Director of the United States Patent and Trademark Office*